United States Patent [19]
Purcell

[11] Patent Number: 5,985,029
[45] Date of Patent: Nov. 16, 1999

[54] CONVEYOR SYSTEM WITH LIFTING MECHANISM

[75] Inventor: Thomas Purcell, Haverhill, Mass.

[73] Assignee: Speedline Technologies, Inc., Haverhill, Mass.

[21] Appl. No.: 08/745,787

[22] Filed: Nov. 8, 1996

[51] Int. Cl.⁶ .............................. B05B 13/02; B65B 15/64
[52] U.S. Cl. ..................... 118/324; 198/345.1; 198/346.2
[58] Field of Search .............................. 198/346.2, 345.1, 198/817; 118/324, 239

[56] References Cited

U.S. PATENT DOCUMENTS

| | | | |
|---|---|---|---|
| 2,997,191 | 8/1961 | Finston . | |
| 3,072,095 | 1/1963 | Keessen et al. | 198/345.1 |
| 3,126,938 | 3/1964 | McCoy | 198/346.2 |
| 3,722,560 | 3/1973 | Morine et al. | 198/346.2 |
| 4,898,268 | 2/1990 | Kamioka et al. | 198/345.1 |
| 5,002,175 | 3/1991 | Drexel et al. | 198/345.3 |

FOREIGN PATENT DOCUMENTS

| | | |
|---|---|---|
| 667 631 A5 | 10/1988 | Switzerland . |
| 2 292 598 | 2/1996 | United Kingdom . |

*Primary Examiner*—David A. Simmons
*Assistant Examiner*—Calvin Padgett
*Attorney, Agent, or Firm*—Mintz, Levin, Cohn, Ferris, Glovsky and Popeo, P.C.

[57] ABSTRACT

A conveyor system has a pair of elongated rails that support a pair of conveyors. A lifting mechanism is mounted to the rails for lifting the conveyor itself, or for lifting the circuit board at its edges near the conveyor. A stripping bar is provided in the rails for lifting stop tabs. The stripping bar and the lifting plates are moved by a cylinder that drives a camming plate along a direction of travel, while this motion is translated into motion transverse to the direction of travel.

28 Claims, 6 Drawing Sheets

CONVEYOR SYSTEM WITH LIFTING MECHANISM

BACKGROUND OF THE INVENTION

This invention relates to a conveyor system for transporting workpieces to a working position for processing.

In known liquid dispensing systems with conveyors for transporting printed circuit boards for manufacture, two parallel spaced rails each support a conveyor, such as a belt or chain. The conveyors transport circuit boards to a working position where a liquid dispenser can dispense a liquid on top of the circuit board. Liquid may be dispensed on the circuit board for a number of different reasons including to deposit glue, epoxy, or solder; to provide an underfill material around a mounted packaged device so that the underfill material wicks under the device and thereafter serves as a heat sink; or to provide a viscous encapsulating liquid that hardens over a component such as an unpackaged die. For some of these applications it is desirable to have a heating system mounted underneath the circuit board when the board is in the working position. Such a heater typically includes a plurality of quartz heating tubes that extend in parallel, transverse to the direction of travel. The conveyors then transport the circuit boards away from the working position.

In typical dispensing systems, between the rails and underneath the conveyors is a horizontal metal plate that can be raised and lowered. A number of lifters are fixed to the metal plate with magnets and are thereby adjustable in position on the metal plate. When the circuit board is transported to the working position as sensed by a detector, the metal plate is raised so that the lifters contact the circuit board from underneath and raise the circuit board to a position where the liquid dispenser can dispense the liquid on the circuit board. After the dispenser has completed its work, the metal plate is lowered so that the board is brought back down onto the conveyor to be transported away from the system.

Such a lifting mechanism that pushes up on the board from underneath has several disadvantages. Some boards may have components on the underside of the board, and thus the lifters may have to be carefully repositioned for different boards to avoid contacting such components. The rails that hold the conveyors can be brought closer together or spread farther apart for boards of different widths. If the width of the board changes, the lifters may have to be repositioned. If the system has heaters underneath the workpiece, the lifters may get in the way and also conduct heat.

Another problem with some conveyor systems is that they have stop tabs with downwardly extending positioning pins that pass through holes in the circuit board when in the working position to cause a fine adjustment to the positioning. When the metal plate is lowered after the workpiece is worked on, the board can get caught on one of the pins, causing the system to shut down.

Lifters such as those described above have a useful aspect, however, in that when a lifter is near the center of the board and the plate is raised, the lifter causes the board to bow upwardly. Such a bowed position is generally considered more favorable for dispensing because it requires less vertical movement for the dispenser. It would be desirable to retain this benefit

OBJECTS AND SUMMARY OF THE INVENTION

It is an object of the present invention to provide a conveyor system with a convenient lifting mechanism that need not be repositioned for differently sized workpieces.

It is another object of the present invention to provide such a lifting mechanism while lifting so that the circuit board bows upwardly.

It is yet another object of the present invention to provide a mechanism for stripping a circuit board from support stops that have positioning pins.

The present invention includes an elongated rail and a conveyor mounted to the rail for transporting the workpiece along a direction of travel to a working position. In preferred embodiments, the workpiece is a circuit board, and in the working position, a liquid dispenser dispenses a liquid onto the circuit board for one of a number of different reasons, such as an epoxy for connection, a material for underfill, or a material for encapsulating a component. A lifting mechanism includes a lifting plate mounted under the conveyor and movable along a direction transverse to the direction of travel, preferably in a vertical direction compared to a horizontal direction of travel. The lifting plate is actuated by a driver that preferably includes a pneumatic cylinder and a camming plate, such that the cylinder moves the camming plate along the direction of travel, and the camming plate transfers that motion into a motion by the lifting plate in the direction transverse to the direction of travel. The lifting plate thus moves from a first position spaced from the conveyor to a second position in which it is contacting and pushing upwardly on the conveyor which is supporting the workpiece.

In another embodiment of the present invention, the lifting plate is mounted under and near the conveyor, such that when the lifting plate is raised, it moves from a first position spaced from the workpiece to a second position in which it contacts the workpiece itself near its side edges to lift the workpiece. In embodiments in which a heated environment is used, the top of the lifting plate is preferably serrated to reduce heat transfer from the workpiece.

In either of these embodiments, a stop plate is mounted to limit the movement of the workpiece along the transverse direction such that the workpiece, and some embodiments also the conveyor, are clamped between the stop plate and the lifting plate. The stop plate preferably has a taper on a lower edge that contracts the workpiece to encourage the workpiece to bow out along the transverse direction.

The present invention may also include a stripping bar mounted in the rail for stripping the workpiece from stop tabs with positioning pins. The stripping bar is rigidly connected to at least one stop tab that has a downwardly extending positioning pin for positioning the workpiece. The stripping bar is preferably driven in a manner generally similar to that described above, i.e., with a pneumatically operated cylinder that moves a camming plate along the direction of travel, with the camming plate transfers that motion into motion by the stripping bar in a direction transverse to the direction of travel. Lifting the stripping bar thus helps to separate the positioning pin from an opening in the workpiece when processing on the workpiece is completed.

The stripping bar and a lifting plate can be driven by a single cylinder connected to separate camming plates, with the cylinder having two inputs and a piston movable between two positions.

The present invention thus provides a convenient lifting mechanism that lifts a workpiece near its edges, either by lifting the workpiece at a location just next to the conveyors or by lifting the conveyors themselves. At least part, and preferably all, of the driving mechanism can be mounted in the rails, and therefore lifters underneath the circuit board are not needed, and it is not necessary to reposition the lifters when the rails are moved farther apart or closer together. This flexibility and adaptability reduces down time and increases throughput. If a heater is used underneath a workpiece, such a lifting mechanism does not block radiant heat. The same driver that lifts the conveyor can also be used to raise a stripping bar that helps to strip the circuit board from positioning pins, and prevent a shutdown of the conveyor. By mounting a driver, such as a pneumatic cylinder with a camming plate, in the rail itself additional space is not needed. The conveyor system described here is simple to operate and requires few parts. Other features and advantages will become apparent from the following detailed description, drawings, and claims.

DETAILED DESCRIPTION

Figure 1:
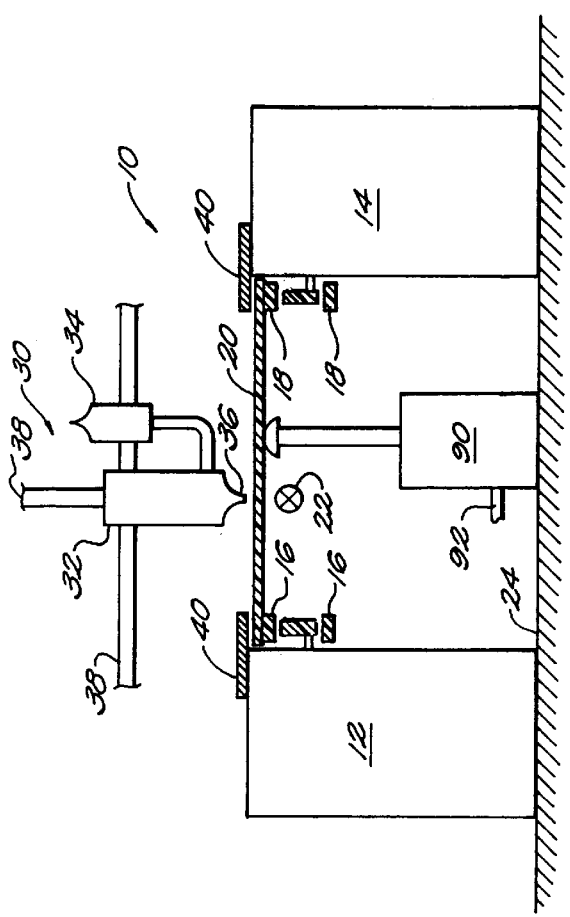
FIG. 1 is a part cross-sectional, part side view of a rail with a lifting mechanism according to a first embodiment of the present invention.

A liquid dispensing system 10 has a pair of elongated parallel rails 12, 14, and at least a pair of elongated conveyors 16, 18 that extend along and next to the rails for supporting and transporting a workpiece 20, such as a circuit board, along a direction of travel 22. Motors (shown in FIGS. 2 and 3) are mounted to rails 12, 14 for driving conveyors 16, 18. Conveyors 16, 18 may be continuous belts, such as a black neoprene over a cotton cord, in which case the conveyor is driven by friction; or they may have a series of links, such as in a steel corded urethane conveyor, with openings for meshing with a cog with teeth connected to the motors to drive the conveyors.

Rails 12, 14 are mounted on a support plate 24 in channels that run transverse to the direction of travel to allow the spacing between the rails to be adjusted. As workpiece 20 is transported into the machine, a detector, such as a vision inspection system (not shown), detects when workpiece 20 is in a working position for processing, e.g., with a liquid dispenser 30 that dispenses liquid onto the workpiece for one of a number of different purposes as noted above. Other conveyors are typically provided to transport the workpiece to and from the conveyors that transport the workpiece to the working position.

Liquid dispenser 30 can be one of a number of known systems, such as one of a number of different models of liquid dispensers sold by Camelot Systems, Inc., of Haverhill, Mass. under the trademark CAM/ALOT® (which is owned by Camelot Systems). Shown generally in FIG. 1, liquid dispenser 30 includes a rotary positive displacement pump 32 that receives liquid under constant low pressure from a syringe 34, and dispenses the liquid through nozzle 36. Valve 32 is mounted to lead screws 38 for computer-controlled movement along the coordinate axes.

Mounted over the top of the rail are one or more stop plates 40 that serve as edge clamps for workpiece 20 when the conveyors 16, 18 are raised. Workpiece 20 is thus pinched between conveyors 16, 18 and stop plate 40. In some embodiments, there are also stop tabs (see especially FIGS. 11–14) with downwardly extending conical pins that help to position the workpiece, which may have holes in standard locations in the corners for that purpose. The inspection system gets the workpiece very close to the appropriate working position and the pins complete the alignment to the appropriate position.

Rails 12, 14 are preferably formed from an extruded aluminum as is generally known. Thereafter, with the device of the present invention, certain openings and pockets are formed in the rails for holding components and to provide openings for components such as studs, to pass through.

Referring to FIGS. 2–5, according to a first embodiment of the present invention, a lifting mechanism for lifting the conveyor with the workpiece is built into rail 12. The lifting mechanism has a lifting plate 50 and a camming plate 52 (shown in dashed lines), both of which are elongated parallel to rail 12 and to direction of travel 22. A pneumatically activated cylinder 54 is connected to camming plate 52. Cylinder 54 moves camming plate 52 parallel to the direction of travel, and camming plate 52 transfers this side-to-side movement into transverse up-and-down vertical movement by lifting plate 50. The camming plate has an elongated and generally rectangular opening 62 for cylinder 54 to minimize the combined width.

Lifting plate 50 has two studs 58 near opposite ends that extend transverse to the plane of lifting plate 50 and into the interior of rail 12. Mounted on the end of each of the two studs are nuts 60, preferably made of a self-lubricating plastic, such as PEEK. Camming plate 52 has angled slots 64 formed therein to provide camming surfaces against which nuts 60 move to raise and lower lifting plate 50. Lifting plate 50 and camming plate 52 are each preferably made of steel plated with porous nickel impregnated with PTFE, referred to as a POLYON® process, to provide nonlubricated bearing surfaces for self-lubricating nuts 60. Slots 64 preferably have an angle of about 25° relative to the horizontal axis. This angle was found to provide the optimal movement in terms of lifting force, speed, and fluid motion, although other angles could be used.

Figure 5:
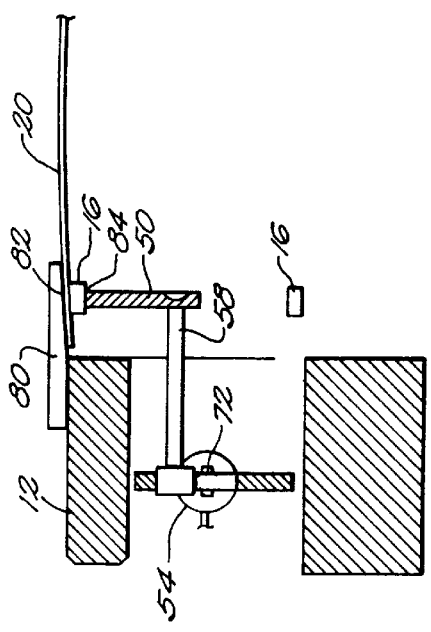

The pneumatic cylinder 54 has a piston 70, the end of which has a fitting 72 connected to camming plate 52, while the other end 73 may be rigidly connected to the rail or a support in the rail. In a non-active position (FIGS. 2 and 4), nuts 60 are at the bottom of slots 64 and lifting plate 50 is at its lowermost position. When cylinder 54 is activated by an input (FIGS. 3 and 5), the piston moves parallel to the axis of elongation of the rails and the direction of travel (left in FIG. 3) thereby moving camming plate 52 along the direction indicated by arrow 76. This movement causes nuts 60 to slide upwardly along angled slots 64 in the camming plate 52. This upward movement of nuts 60 raises studs 58 and therefore lifting plate 50 to which studs 58 are rigidly connected. When raised, lifting plate 50 raises conveyor 16 transverse to the direction of travel along with workpiece 20 until workpiece 20 and conveyor 16 are clamped between a stop plate 80 and lifting plate 50 (FIG. 5). The upward force caused by the cylinder and the camming plate should be weak enough so that when workpiece 20 contacts stop plate 80, lifting plate 50 stops moving upwardly. Consequently, it does not matter to this system if the thickness of the workpiece changes.

Figure 6:
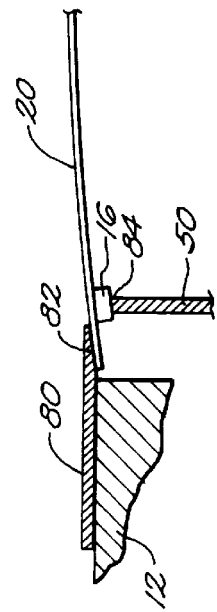

As shown in FIGS. 5 and 6, stop plate 80 has a lower edge 82 tapered at an acute angle relative to a horizontal plane to urge workpiece 20 to have an upward angle at the outside edge. Tapered lower edge 82 thus helps to create an upwardly bowed shape in the workpiece. A top edge 84 of lifting plate 50 can also have a taper generally parallel to that of edge 82 of stop plate 80.

FIGS. 5 and 6 differ only in the location of lifting plate 50. In FIG. 5, lifting plate 50 is directly under stop plate 80, while in FIG. 6, lifting plate 50 is spaced slightly from stop plate 80. In either case, the workpiece, such as a printed circuit board, has the desired upwardly bowed shape.

Referring again to FIG. 1, if desired, a pneumatically activated auxiliary lifter 90 can be provided on a support plate 24 underneath workpiece 20 between rails 12, 14. Auxiliary lifter 90 is mounted underneath workpiece 20 so that when workpiece 20 is in the working position, auxiliary lifter 90 is pneumatically activated to push upwardly on the workpiece. Lifter 90 is preferably pneumatically driven because the lifting mechanism of the present invention obviates the need for a metal plate that is raised and lowered with known lifters.

Figure 7:
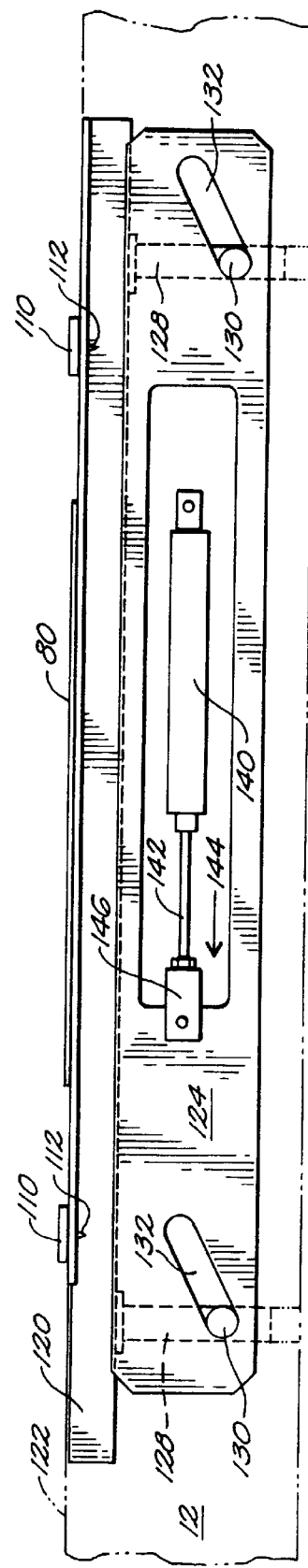
FIGS. 7 and 8 are side views illustrating a second embodiment of the present invention.
Figure 8:
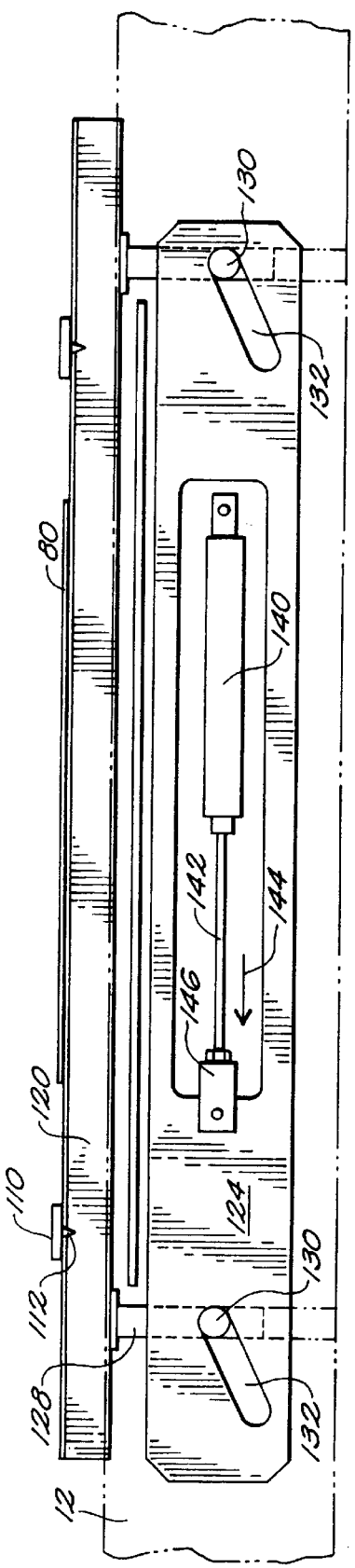

Referring to FIGS. 7 and 8, in addition to stop plate 80, there can be other stop tabs 110 with downwardly extending pins 112 that can be pyramidal, and preferably conical. Tabs 110 are mounted in the top of the rails and can be adjusted along the direction of travel in the rails, and have slots to allow then to be adjusted horizontally transverse to the direction of travel (this is shown best in FIGS. 11 and 13). Pins 112 extend through openings (not shown) in defined locations in workpiece 20. As noted above, when the workpiece is lowered, whether with the lifting mechanism of the present invention or with known lifters on a central movable plate, the workpiece may not completely come free of pins 112 and thus can get caught, thereby shutting down the system.

To address this problem, in a second embodiment of the present invention, a conveyor system includes a stripping bar 120 formed in rail 12 and movable in a vertical direction transverse to the direction of travel. Stripping bar 120 is centered in and flush with a top surface 122 of rail 12 when in a non-active (non-stripping) position (FIG. 7). A channel is formed in bar 20 where stop tabs 110 are mounted, so bar 120 and tabs 110 are rigidly connected when in operation. Bar 120 has two downwardly extending studs 128 with transversely rods for holding nuts 130 that are then positioned in angled camming slots 132 in a camming plate 124. When the conveyor is lowered by whatever means (whether with lifting plates as described above or with known lifters), bar 120 is raised by activating pneumatically actuated cylinder 140 to help disengage pins 112 from openings in workpiece 20 (FIG. 8).

In response to a pneumatic input, cylinder 140 causes a piston 142 to move along a direction 144. At the end of piston of 142 is a fitting 146 that is connected to camming plate 124. As camming plate 124 is moved along direction 144, nuts 130 slide up angled slots 132 in camming plate 124, thereby raising bar 120 as shown in FIG. 8. Therefore, as the workpiece is lowered, the pins are raised to help strip the workpiece from the pins.

Figure 2:
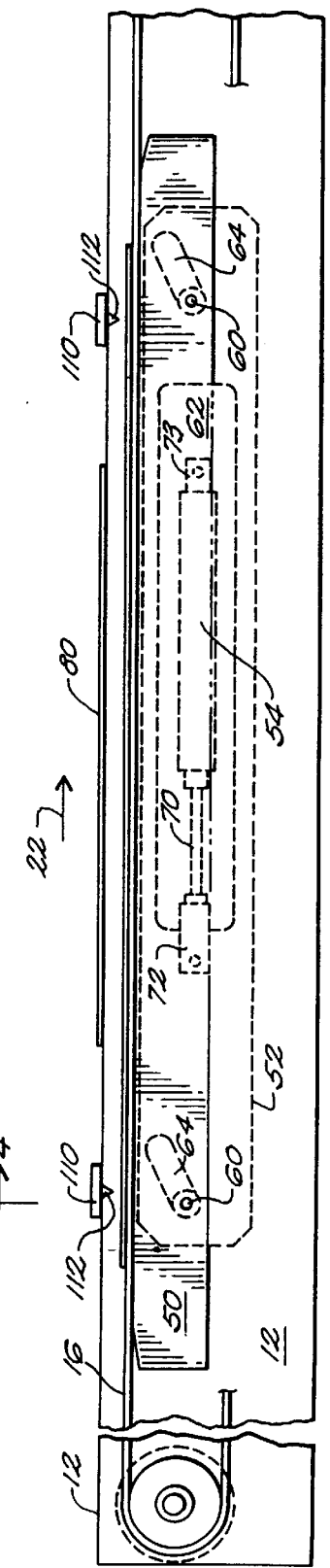
FIGS. 2–3 are side views of a system such as that in FIG. 1 with a lifting mechanism in respective lower and upper positions.
Figure 3:
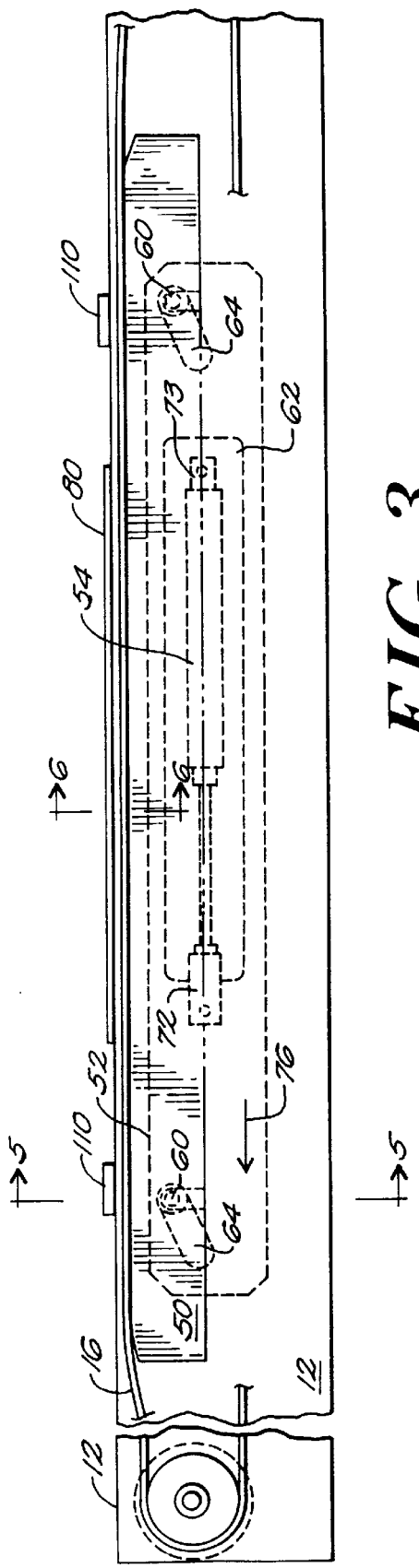
Figure 4:
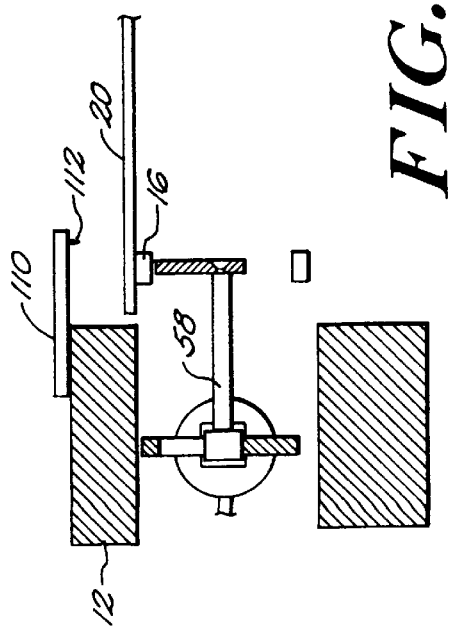
FIGS. 4–6 are cross-sectional views taken through section lines 4—4 of FIG. 2, and 5—5 and 6—6 of FIG. 3.
Figure 10:
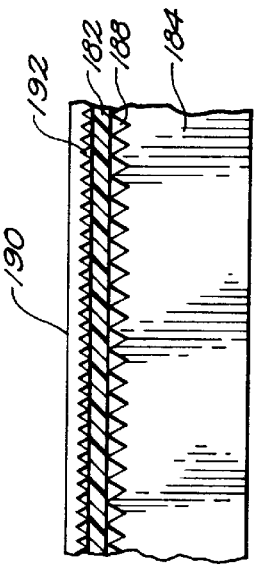
FIGS. 9 and 10 are side views illustrating a third embodiment of the present invention.
Figure 9:
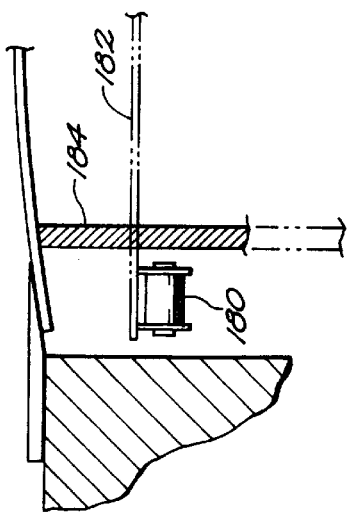

Referring to FIGS. 9–10 according to a third embodiment of the present invention, the conveyor system is generally similar to that described in connection with FIGS. 1–3, except that a conveyor 180 has a series of links that transport a workpiece 182 (shown in dashed lines). According to this embodiment, a pneumatically activated cylinder and camming plate are used as described in conjunction with FIGS. 2–6. Unlike that embodiment, however, a lifting plate does not raise conveyor 180 itself, but rather a lifting plate 184 raises workpiece 182 itself at a position adjacent conveyor 180. Lifting plate 184 is similar to that shown in the embodiment of FIGS. 2–5 except that it may have a serrated top surface 188 so that there is less heat transfer from workpiece 182 through lifting plate 184, a consideration that may be useful if the conveyor system is used in a heated environment. A stop plate 190 mounted over the rail also has a serrated inner edge 192, also for reducing heat transfer.

As in the embodiment of FIGS. 2–6, because the lifting mechanisms move with the respective rails if they are repositioned, there is no need to realign the lifting mechanisms if the width of the workpiece changes.

Referring to FIGS. 11–14, the lifting mechanisms of FIGS. 2–6 or FIGS. 9 and 10 and the shipping bar of FIGS. 7–8 can be effectively combined in a single conveyor system. To reduce the number of parts and the complexity in operation, it is preferable to use a single pneumatically activated cylinder 202 such as a model NCDJ2D16-200B, made by SMC. This cylinder has two inputs ports that receive a pneumatic input to operate first and second camming plates to move the lifting plate and the stripper bar.

Figure 11:
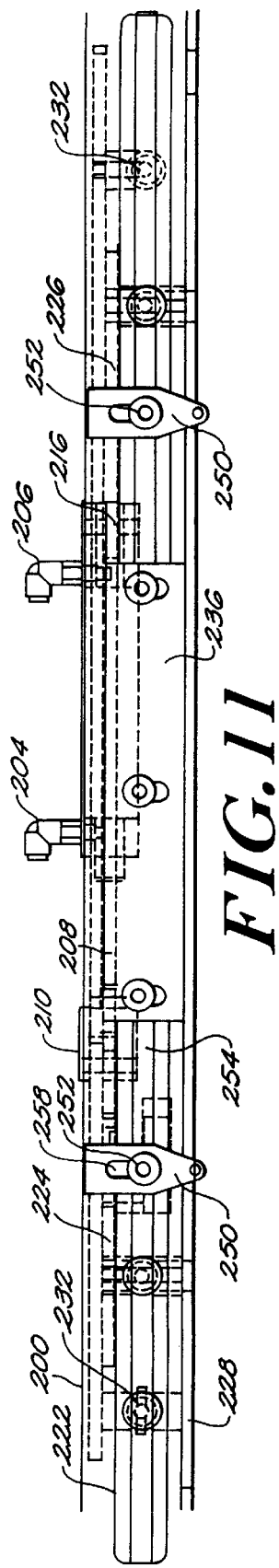
FIGS. 11 and 13 are side views and FIGS. 12 and 14 are plan views illustrating two positions according to a fourth embodiment of the present invention.
Figure 12:
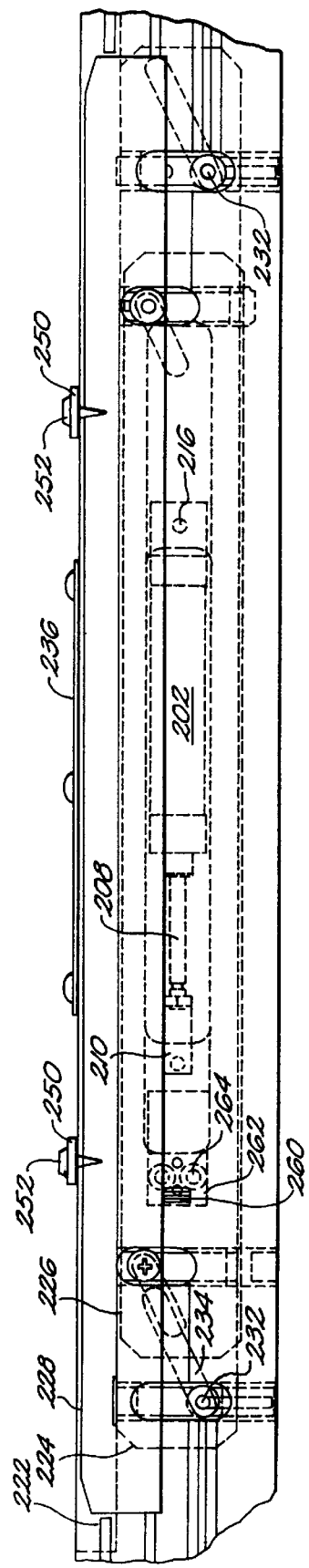
Figure 13:
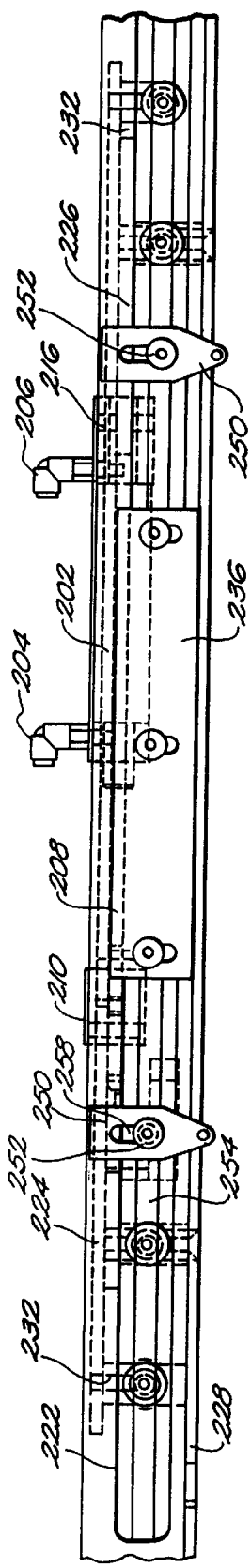
Figure 14:
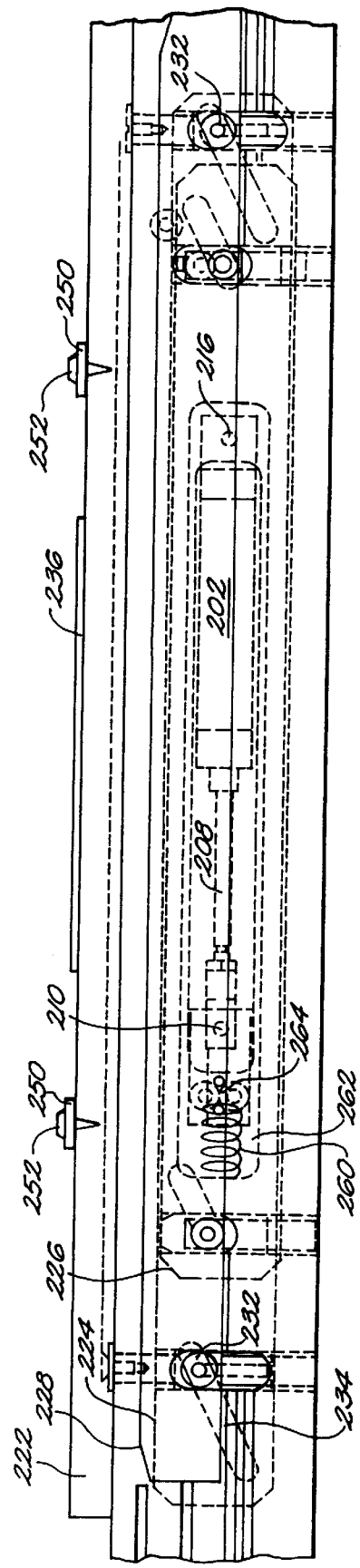

FIGS. 11 and 12 are a plan view and a side view with a lifting plate 220 in an up position and a stripping bar 222 in a down position, and FIGS. 13 and 14 are a plan view and a side view showing lifting plate 220 down and stripping bar 222 up.

A rail 200 encloses pneumatic cylinder 202 with two input ports 204, 206, such that cylinder 202. As shown here, the cylinder does not require additional space in the cross-section of the rail. Alternatively, a cylinder and other parts of a driving mechanism could be mounted wholly or partially outside the rail.

Cylinder 202 has a piston 208 that is movable between two positions. Cylinder 202 has a first fitting 212 at the end of piston 208 for rigid connection to a first camming plate 224, and a second fitting 216 at the opposite end for connection to second camming plate 226. Thus cylinder 202 is mounted between the two movable camming plates.

When the system is waiting for a workpiece to be transported to the working position, port 206 is activated and port 204 is vented, causing piston 208 to be fully extended to a first position (FIGS. 13 and 14) in which stripping bar 222 is in an up position and a lifting plate 228 is in a down position. When a workpiece is brought into the working position, port 204 is activated and port 206 is vented, causing piston 208 to retract to a second position (FIGS. 11 and 12). In this second position, the lifting plate is raised to move the conveyor and workpiece to a raised position for processing, while stop tabs with positioning pins are lowered to position and hold the workpiece. When moving back to the first position after processing is done, the lifting plate is lowered and the stripping bar with the tabs and pins are raised to strip the pins from the workpiece.

Because cylinder 202 is mounted at each end to the movable camming plates, a biasing mechanism, such as a compression spring 260, is provided in a spring pocket 262 in the rail to cause camming plate 224 to move first. Spring 260 is anchored against the rail with a support 264 to bias second camming plate 226 with sufficient resistance to effectively anchor cylinder 202 to the end with fitting 216 when the piston is first moved. Consequently, when piston 208 first begins to move from the first position to the second position, spring 260 biases camming plate 226 to the right (as shown in the figures) so that first camming plate 224 moves to the right, rather than fitting 216 and camming plate 226 moving to the left. This rightward movement by camming plate 224 causes nuts 232 to move down along angled slots 234, thus pulling stripping bar 222 down into rail 200 until a stop plate 236 contacts the top of rail 200 to complete its downward motion.

When stripping bar 222 and first camming plate 224 are physically stopped from moving, the continued motion of piston 208 causes camming plate 226 to move against the biasing force of spring 260, and therefore fitting 216 and second camming plate 226 now move to the left past camming plate 224 and against spring 260. This leftward motion drives lifting plate 220 upwardly to take up any remaining space between the conveyor, workpiece, and stop plate 230. Because the spring prevents camming plate 226 from moving until stop plate 230 is in full contact with the rail, a constant registration point from workpiece to workpiece is established regardless of any variation in the thickness of the workpiece. With this structure, cylinder 202 and camming plates 224, 226 effectively float within the body of the rail. This structure makes the system easy to operate because there are only two inputs and two separate positions. Other approaches could be taken, however, in which there are separate controls and additional positions, such as a position with the lifting plate down and the stripping bar down.

As indicated in FIGS. 11–14, the driving mechanism, including the cylinder and camming plates are all enclosed in the rail without increasing its overall cross-sectional area. The plan views also provide a good view of the stop tabs 250 shown held with adjustable bolts 252 in a channel 254 in stripping bar 222. The bolts can be tightened to secure tabs 250, or loosened to allow tabs 250 to be moved along the direction of travel or along slots 258 in tabs 250 transverse to the direction of travel.

Other embodiments are within the appended claims. For example, the driver could include a hydraulic cylinder or a motor with a reversible screw rather than a pneumatic cylinder.

What is claimed is:

1. A conveyor system for transporting a workpiece to a working position, the system comprising:

first and second elongated conveyors for transporting the workpiece along a direction of travel to the working position;

first and second rails elongated along first and second parallel axes parallel to the direction of travel, the first and second rails being spaced apart, the first and second rails supporting the respective first and second conveyors;

first and second lifting plates movably mounted under the respective first and second conveyors and movable in a direction transverse to the first and second axes and the direction of travel; and first and second drivers mounted in the rails for moving the respective first and second lifting plates between a first position in which the lifting plates are spaced from the respective first and second conveyors and a second position in which the lifting plates contact the respective first and second conveyors to move the conveyors and the workpiece along the direction transverse to the direction of travel when the workpiece is in the working position.

2. The system of claim 1, wherein the direction of travel is horizontal and the transverse direction is vertical, the first position being a lower position and the second position being an upper position.

3. The system of claim 1, further comprising a stop plate mounted to the first rail and positioned such that when the first lifting plate is in the second position, the workpiece and the first conveyor are clamped between the stop plate and the first lifting plate.

4. The system of claim 3, wherein the stop plate has a lower surface that contacts the workpiece, the lower surface having a taper portion for causing the workpiece to bow upwardly when urged against the stop plate by the lifting plate.

5. The system of claim 1, wherein the first driver includes a first camming plate with an angled slot, and the first lifting plate includes at least one stud rigidly connected to the first lifting plate and extending into the angled slot, the interaction of the slot and stud transferring motion of the camming plate in one direction into motion of the lifting plates.

6. The system of claim 5, wherein the angled slot has an angle of 25° relative to a horizontal plane.

7. The system of claim 5, wherein the driver includes a pneumatically driven cylinder mounted in the rail and having a fitting rigidly connected to the camming plate.

8. The system of claim 5, further comprising a bar mounted in the first rail, the first driver further including a second camming plate for causing the bar to move transverse to the direction of travel.

9. The system of claim 1, further comprising a liquid dispensing system mounted over the conveyor system for dispensing a liquid on the workpiece when the workpiece is in the working position.

10. The system of claim 1, further comprising first and second bars mounted in the respective first and second rails, each bar being connected to a stop plate that contacts the workpiece when the lifting plate contacts the conveyor, each bar being movable in the direction transverse to the direction of travel to a position in which the stop plate is spaced from the workpiece.

11. The system of claim 10, wherein each of the drivers includes a mechanism that provides linear motion, a first camming plate rigidly connecting to the mechanism and movably connected to the lifting plate, and a second camming plate rigidly connected to the mechanism and movably connected to the respective bar.

12. The system of claim 11, wherein the mechanism is a pneumatic cylinder.

13. A conveyor system for transporting a workpiece to a working position, the system comprising:

first and second elongated conveyors for transporting the workpiece along a direction of travel;

first and second rails elongated along first and second parallel axes, the first and second rails being spaced apart, the first and second rails supporting and next to the respective first and second conveyors;

first and second lifting plates elongated along the direction of travel and mounted to the respective first and second rails, adjacent the respective first and second conveyors, movable in a direction transverse to the first and second axes between a first position and second position, and positioned to contact the workpiece in the second position; and first and second drivers mounted in the rails for moving the first and second lifting plates in the transverse direction from the first position in which the lifting plates are spaced from the workpiece to the second position in which the lifting plates are in contact with the workpiece.

14. The system of claim 13, wherein the lifting plate has a top surface for contacting the workpiece, the top surface having a serrated edge.

15. The conveyor system of claim 13, further comprising a stop plate mounted to the rail and positioned so that when the lifting plate raises the workpiece, the workpiece is clamped between the stop plate and the lifting plate.

16. The system of claim 15, wherein the stop plate has a lower edge for contacting the workpiece, the lower edge being serrated.

17. The system of claim 13, wherein the driver includes a camming plate with angled slots, and the lifting plates includes studs rigidly connected to the lifting plates and extending into the angled slots, the angled slots transferring horizontal motion of the camming plates to vertical motion of the lifting plates.

18. The system of claim 13, further comprising a liquid dispensing system mounted over the conveyor system for dispensing a liquid on the workpiece when the workpiece is in the working position.

19. The system of claim 13, further comprising first and second bars mounted in the respective first and second rails, each bar being movable in the direction transverse to the direction of travel.

20. The system of claim 19, wherein each of the drivers includes a mechanism that receives an input and provides linear motion, a first camming plate rigidly connecting to the mechanism and movably connected to the lifting plate, and a second camming plate rigidly connected to the mechanism and movably connected to the bar.

21. A conveyor system for transporting a workpiece to a working position, the system comprising:
   a first elongated conveyor for transporting the workpiece along a direction of travel;
   a first elongated rail supporting the first conveyor;
   a bar mounted in the rail and movable along a vertical direction transverse to the direction of travel;
   a stop member rigidly connected to the bar, the stop member in contact with the workpiece when the workpiece is in the working position; and
   a first driver for moving the bar along the transverse direction from a first position such that the stop member is in contact with the workpiece to a second position in which the stop member is moved so that the stop member is vertically spaced from the workpiece.

22. The system of claim 21, wherein the first driver includes a first camming plate with an angled slot, and the bar includes at least one stud rigidly connected to the bar and extending into the angled slot, the interaction of the slot and stud transferring motion of the camming plate in one direction into motion of the bar.

23. The system of claim 22, wherein the angled slot has an angle of 25° relative to a horizontal plane.

24. The system of claim 22, wherein the driver includes a pneumatically driven cylinder mounted in the rail and having a fitting rigidly connected to the camming plate.

25. A conveyor system for transporting a workpiece to a working position, the system comprising:
   a first elongated conveyor for transporting the workpiece along a direction of travel to the working position;
   a first elongated rail for supporting the conveyor, the rail being positioned next to the conveyor and elongated in the direction of travel;
   a first lifting plate mounted under the first conveyor and movable in a direction transverse to the direction of travel; and
   a first driver mounted in the first rail for moving the first lifting plate against the first conveyor to cause the workpiece to be moved in a direction transverse to the direction of travel when the workpiece is in the working position.

26. The conveyor system of claim 25, further comprising a second conveyor for transporting the workpiece, a second rail, a second lifting plate, and a second driver, each substantially identical to the first conveyor, rail, lifting plate and driver, with the second conveyor and rail parallel to the first conveyor and rail.

27. A conveyor system for transporting a workpiece to a working position, the system comprising:
   a first elongated conveyor for transporting the workpiece;
   a first elongated rail for supporting the first conveyor, the first rail being elongated parallel to and next to the first rail;
   first means, mounted in the first rail, for moving the workpiece in a vertical direction transverse to the direction of travel between a first position and a second position when the workpiece is in the working position; and
   a stop with a positioning pin for engaging the workpiece to position the workpiece when in the working position, the system further comprising means, coupled to the pin, for stripping the workpiece from the pin.

28. A conveyor system for transporting a workpiece to a working position, the system comprising:
   a first elongated conveyor for transporting the workpiece;
   a first elongated rail for supporting the first conveyor, the first rail being elongated parallel to and next to the first rail;
   first means, mounted in the first rail, for moving the workpiece in a vertical direction transverse to the direction of travel between a first position and a second position when the workpiece is in the working position;
   a second elongated conveyor for transporting the workpiece;
   a second elongated rail for supporting the conveyor, the second rail being elongated parallel to and next to the second conveyor; and
   second means, mounted in the second rail, for moving the workpiece transverse to the direction of travel between the first position and the second position when the workpiece is in the working position, the first and second elongated conveyors and rails being oriented in parallel and space apart.

* * * * *